United States Patent
Wu et al.

(10) Patent No.: US 6,958,512 B1
(45) Date of Patent: Oct. 25, 2005

(54) NON-VOLATILE MEMORY DEVICE

(75) Inventors: Yider Wu, Campbell, CA (US); Shibly S. Ahmed, San Jose, CA (US); Haihong Wang, Milpitas, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/770,010

(22) Filed: Feb. 3, 2004

(51) Int. Cl.$^7$ ............................................ H01L 29/788
(52) U.S. Cl. ................... 257/315; 257/327; 257/347; 257/618
(58) Field of Search ................. 257/315, 327, 257/347, 618

(56) References Cited

U.S. PATENT DOCUMENTS

| | | | |
|---|---|---|---|
| 5,411,905 A | 5/1995 | Acovic et al. | 438/156 |
| 6,657,252 B2 * | 12/2003 | Fried et al. | 257/316 |
| 6,768,158 B2 * | 7/2004 | Lee et al. | 257/315 |
| 2002/0072170 A1 | 6/2002 | Lam | 438/239 |
| 2002/0137271 A1 | 9/2002 | Forbes et al. | 438/201 |
| 2003/0178670 A1 | 9/2003 | Fried et al. | 257/315 |

OTHER PUBLICATIONS

Copy of co-pending U.S. Appl. No. 10/929,538, Yu et al., filed Aug. 31, 2004, entitled "Non-Volatile Memory Device", 25 pages.

Digh Hisamoto et al., "FinFET-A Self-Aligned Double-Gate MOSFET Scalable to 20 nm," IEEE Transactions on Electron Devices, vol. 47, No. 12, Dec. 2000, pp. 2320-2325.

Yang-kyu Choi et al., "Sub-20nm CMOS FinFET Technologies," 2001 IEEE, IEDM, pp. 421-424.

Xuejue Huang et al., "Sub-50 nm P-Channel FinFET, " IEEE Transactions on Electron Devices, vol. 48, No. 5, May 2001, pp. 880-886.

Xuejue Huang et al., "Sub 50-nm FinFET: PMOS," 1999 IEEE, IEDM, pp. 67-70.

Yang-Kyu Choi et al., "Nanoscale CMOS Spacer FinFET for the Terabit Era," IEEE Electron Device Letters, vol. 23, No. 1, Jan. 2002, pp. 25-27.

* cited by examiner

Primary Examiner—David Nelms
Assistant Examiner—Tu-Tu Ho
(74) Attorney, Agent, or Firm—Harrity & Snyder, LLP

(57) ABSTRACT

A non-volatile memory device includes a substrate, an insulating layer, a fin, a conductive structure and a control gate. The insulating layer may be formed on the substrate and the fin may be formed on the insulating layer. The conductive structure may be formed near a side of the fin and the control gate may be formed over the fin. The conductive structure may act as a floating gate electrode for the non-volatile memory device.

21 Claims, 11 Drawing Sheets

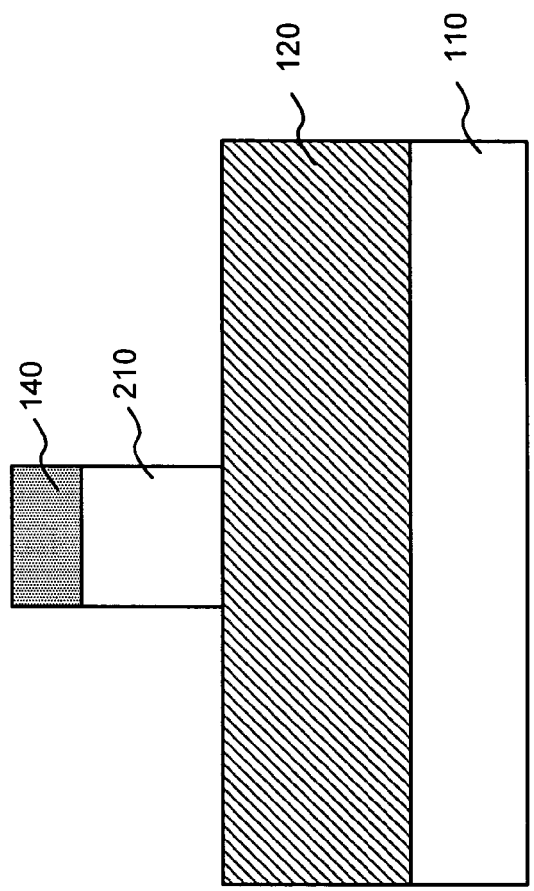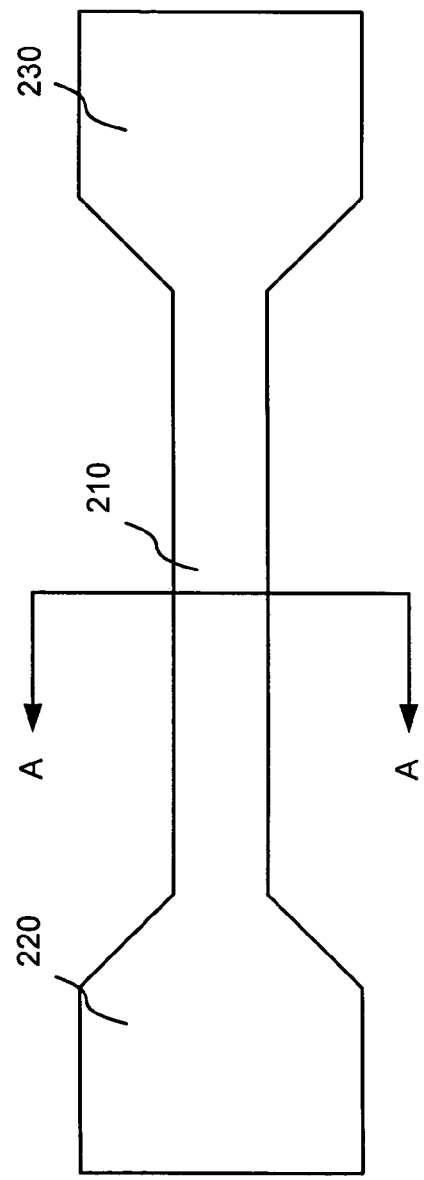

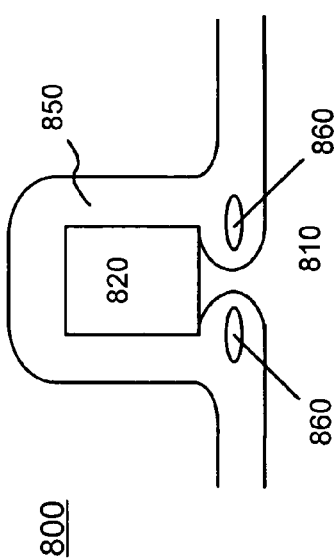
FIG. 8A
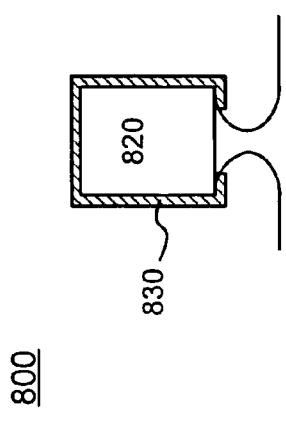
FIG. 8B
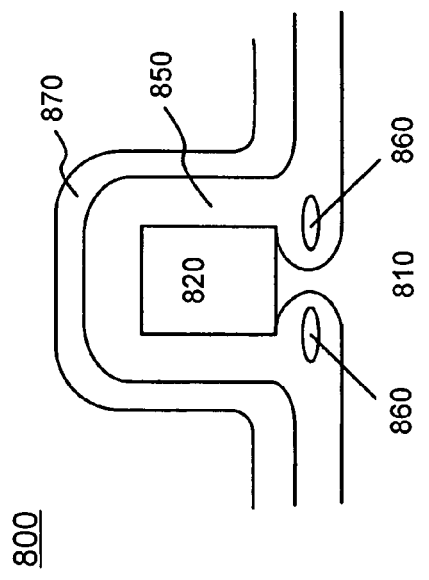
FIG. 8D
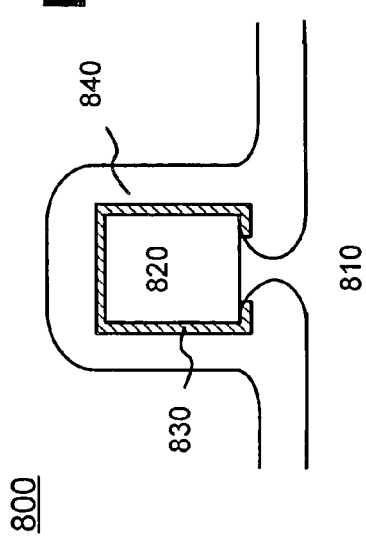
FIG. 8C
FIG. 8E

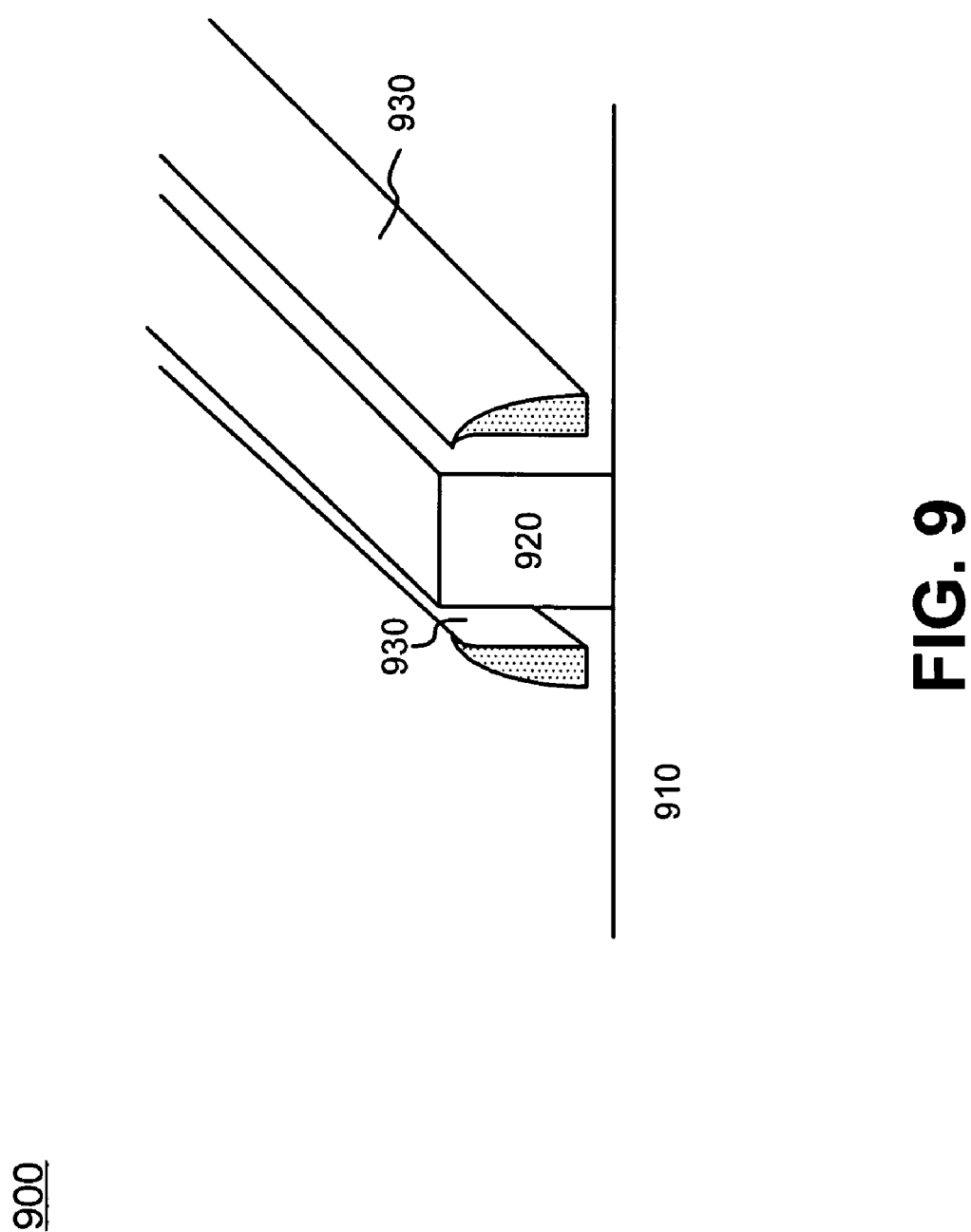

NON-VOLATILE MEMORY DEVICE

TECHNICAL FIELD

The present invention relates to memory devices and methods of manufacturing memory devices. The present invention has particular applicability to non-volatile memory devices.

BACKGROUND ART

The escalating demands for high density and performance associated with non-volatile memory devices require small design features, high reliability and increased manufacturing throughput. The reduction of design features, however, challenges the limitations of conventional methodology. For example, the reduction of design features makes it difficult for the memory device to meet its expected data retention requirement, e.g., a ten year data retention requirement.

DISCLOSURE OF THE INVENTION

Implementations consistent with the present invention provide a non-volatile memory device formed using a fin structure. Conductive structures formed near each side of the fin structure may function as floating gate electrodes for the non-volatile memory device. A dielectric layer and a conductive layer may be formed over the fin structure and floating gate electrodes. The conductive layer may function as the control gate and may be separated from the floating gate by the dielectric layer.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a memory device that includes a substrate, an insulating layer, a fin structure, at least one conductive structure and a control gate. The insulating layer is formed on the substrate and the fin structure is formed on the insulating layer. The at least one conductive structure is formed near a side of the fin structure and acts as a floating gate electrode for the memory device. The control gate is formed over the fin structure.

According to another aspect of the invention, a method of manufacturing a non-volatile memory device is provided. The method includes forming a fin on an insulating layer, where the fin acts as a substrate for the non-volatile memory device. The method also includes forming at least one dielectric structure adjacent a side surface of the fin and forming at least one conductive structure adjacent the at least one dielectric structure, where the at least one conductive structure acts as a floating gate electrode for the non-volatile memory device. The method further includes forming source and drain regions, depositing a gate material over the fin, the at least one dielectric structure and the at least one conductive structure and patterning and etching the gate material to form a control gate.

According to another aspect of the invention, a non-volatile memory array that includes a substrate, an insulating layer, a number of conductive fins, a dielectric, a number of conductive structures and a number of gates is provided. The insulating layer is formed on the substrate and the conductive fins are formed on the insulating layer. The conductive fins act as substrate electrodes for the non-volatile memory array. The dielectric is formed adjacent side surfaces and over a top surface of each of the conductive fins and the conductive structures are formed near side surfaces of each of the conductive fins and adjacent the dielectric. The conductive structures act as floating gate electrodes for the non-volatile memory array. The gates are formed over the fins and the conductive structures and act as word lines for the non-volatile memory array.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIG. 2A is a cross-section illustrating the formation of a fin in accordance with an exemplary embodiment of the present invention.

FIG. 2B is a top view illustrating the fin of FIG. 2A along with source and drain regions formed adjacent the fin in accordance with an exemplary embodiment of the present invention.

FIGS. 8A–8E are cross-sections illustrating the formation of a semiconductor device with floating gate electrodes formed below a fin in accordance with another embodiment of the present invention.

FIG. 9 is a cross-section illustrating the formation of a semiconductor device with a split gate electrode in accordance with another embodiment of the present invention.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide non-volatile memory devices, such as electrically erasable programmable read only memory (EEPROM) devices, and methods of manufacturing such devices. The memory device may include a fin field effect transistor (FinFET) structure with conductive structures formed near the fin acting as a floating gate electrode.

Figure 1:
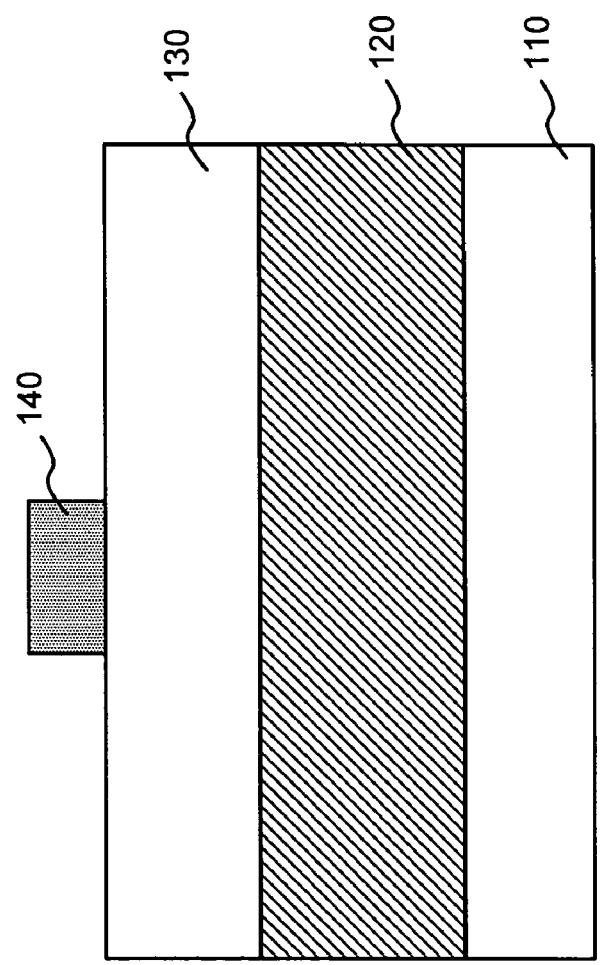
FIG. 1 is a cross-section illustrating exemplary layers that may be used for forming a fin in accordance with an embodiment of the present invention.

FIG. 1 illustrates the cross-section of a semiconductor device 100 formed in accordance with an embodiment of the present invention. Referring to FIG. 1, semiconductor device 100 may include a silicon on insulator (SOI) structure that includes a silicon substrate 110, a buried oxide layer 120 and a silicon layer 130 on the buried oxide layer 120. Buried oxide layer 120 and silicon layer 130 may be formed on substrate 110 in a conventional manner.

In an exemplary implementation, buried oxide layer 120 may include a silicon oxide, such as $SiO_2$, and may have a thickness ranging from about 50 Å to about 1000 Å. Silicon layer 130 may include monocrystalline or polycrystalline silicon having a thickness ranging from about 100 Å to about 3000 Å. Silicon layer 130 may be used to form a fin structure, as described in more detail below.

In alternative implementations consistent with the present invention, substrate 110 and layer 130 may comprise other semiconducting materials, such as germanium, or combinations of semiconducting materials, such as silicon-germanium. Buried oxide layer 120 may also include other dielectric materials.

Optionally, a dielectric layer, such as a silicon nitride layer or a silicon oxide layer (not shown), may be formed over silicon layer 130 to act as a protective cap during subsequent etching processes.

A photoresist material may be deposited and patterned to form a photoresist mask 140 for subsequent processing, as illustrated in FIG. 1. The photoresist material may be deposited and patterned in any conventional manner.

Semiconductor device 100 may then be etched. In an exemplary implementation, silicon layer 130 may be etched in a conventional manner, with the etching terminating on buried oxide layer 120, as illustrated in FIG. 2A. Referring to FIG. 2A, the portion of silicon layer 130 located under photoresist mask 140 has not been etched, thereby forming a fin 210 comprising silicon. In an exemplary implementation, the width of fin 210 ranges from about 100 Å to about 3000 Å. Fin 210 may function as a substrate electrode for semiconductor device 100, as described in more detail below.

During the formation of fin 210, bitline pickup or source and drain regions may also be formed adjacent the respective ends of fin 210. For example, silicon layer 130 may be patterned and etched to form bitline pickup or source and drain regions. FIG. 2B illustrates a top view of semiconductor 100 including source region 220 and drain region 230 formed adjacent fin 210 on buried oxide layer 120, according to an exemplary embodiment of the present invention. Buried oxide layer 120 and photoresist mask 140 are not illustrated in FIG. 2B for simplicity.

Figure 3A:
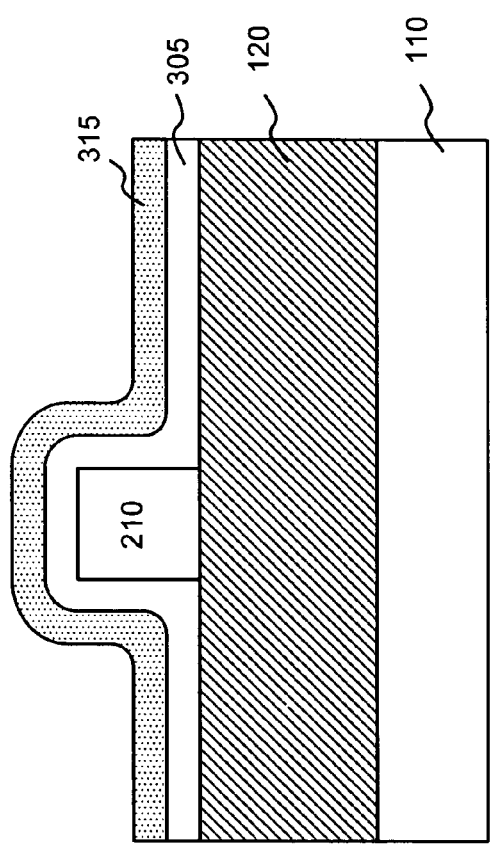
FIGS. 3A and 3B are cross-sections illustrating the formation of spacers and conductive structures adjacent the fin of FIG. 2A in accordance with an exemplary embodiment of the present invention.

Photoresist mask 140 may then be removed. A dielectric layer 305, such as an oxide layer, may then be deposited or grown over semiconductor device 100, as illustrated in FIG. 3A. The cross-section illustrated in FIG. 3A is taken along line AA in FIG. 2B. Referring to FIG. 3A, dielectric layer 305 may be formed on the exposed surfaces of fin 210 and on buried oxide layer 120 adjacent fin 210. In an exemplary implementation consistent with the present invention, dielectric layer 305 may have a thickness ranging from about 20 Å to about 200 Å.

Figure 3B:
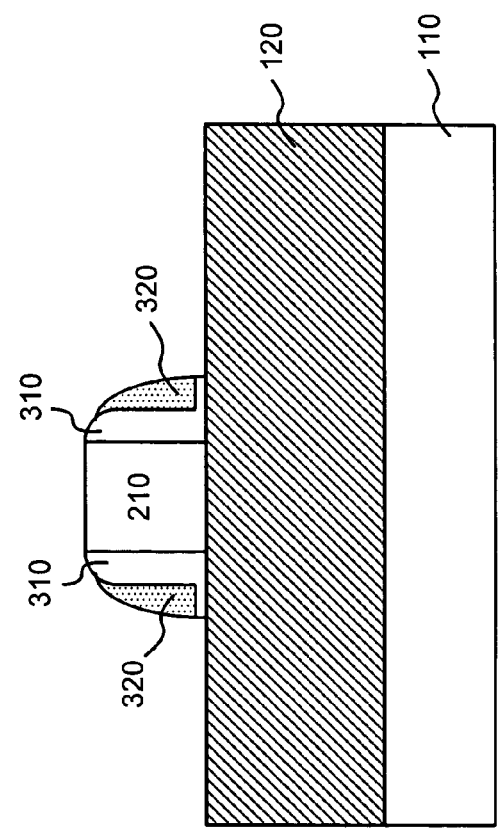

After dielectric layer 305 is formed, a conductive layer 315, such as a polycrystalline silicon, may be deposited over dielectric layer 305, as illustrated in FIG. 3A. Dielectric layer 305 and conductive layer 315 may then be etched to form structures 310 and 320, respectively, as illustrated in FIG. 3B. Structures 310, also referred to as spacers 310, may be formed on buried oxide layer 120 adjacent each side of fin 210. Structures 320 may be formed adjacent spacers 310. In an exemplary implementation consistent with the present invention, the width of structures 320 may range from about 50 Å to about 1200 Å. Structures 320 may act as floating gate electrodes for the subsequently formed memory device.

Figure 4:
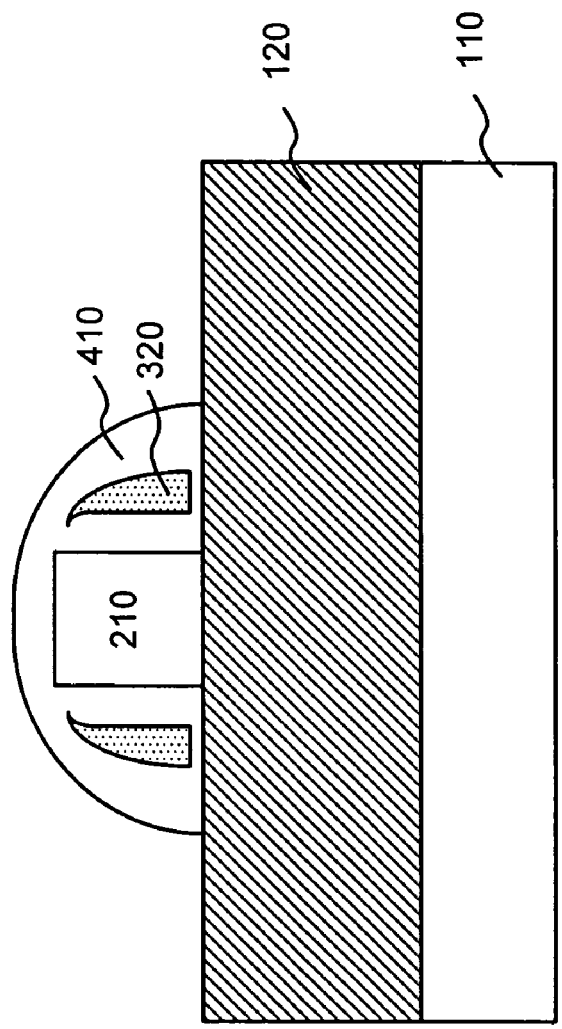
FIG. 4 is a cross-section illustrating the formation of a dielectric layer over the fin of FIG. 3 in accordance with an exemplary embodiment of the present invention.

Another dielectric layer 410, such as an oxide layer (e.g., an $SiO_2$ layer), an ONO layer, etc., may then be deposited or grown over fin 210, spacers 310 and structures 320, as illustrated in FIG. 4. The thickness of dielectric layer 410 may range from about 40 Å to about 250 Å. In an exemplary implementation, dielectric layer 410 and spacers 310 are both the same dielectric material, e.g., $SiO_2$, and may form a single dielectric layer 410, as illustrated in FIG. 4. Dielectric layer 410 may function as an inter-gate dielectric for the subsequently formed memory device.

Figure 5:
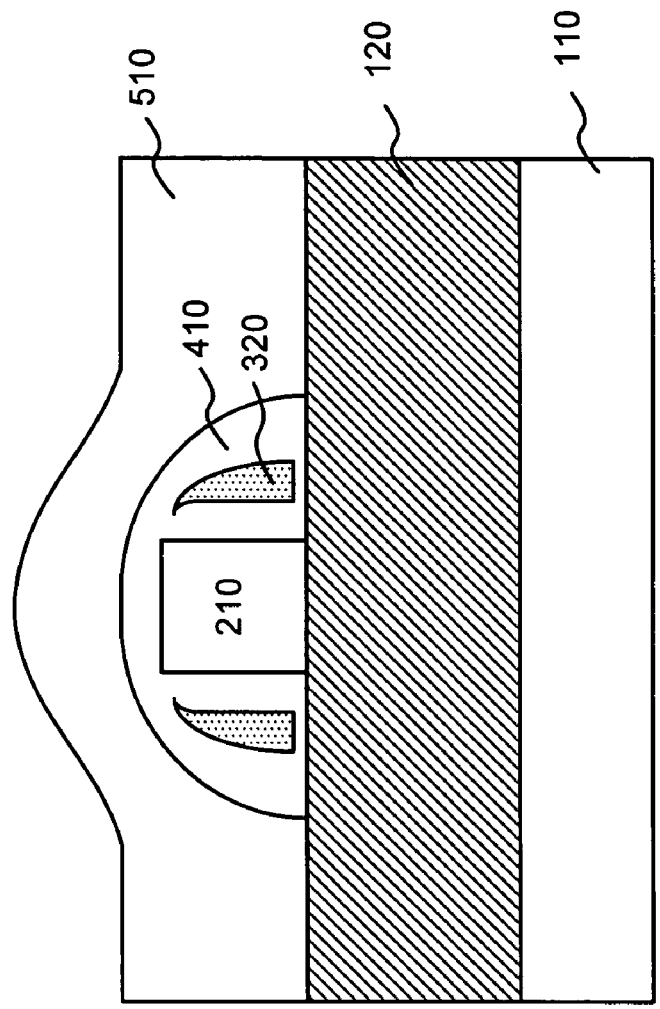
FIG. 5 is a cross-section illustrating the formation of a control gate material on the device of FIG. 4 in accordance with an exemplary embodiment of the present invention.

A conductive layer 510 may then be deposited over semiconductor device 100, as illustrated in FIG. 5. Conductive layer 510 may be used as gate material for a subsequently formed control gate electrode. In an exemplary implementation, conductive layer 510 may comprise polysilicon deposited using conventional chemical vapor deposition (CVD) to a thickness ranging from about 400 Å to about 4000 Å in a channel region of semiconductor device 100. Alternatively, other semiconducting materials, such as germanium or combinations of silicon and germanium, or various metals may be used as the gate material.

Figure 6:
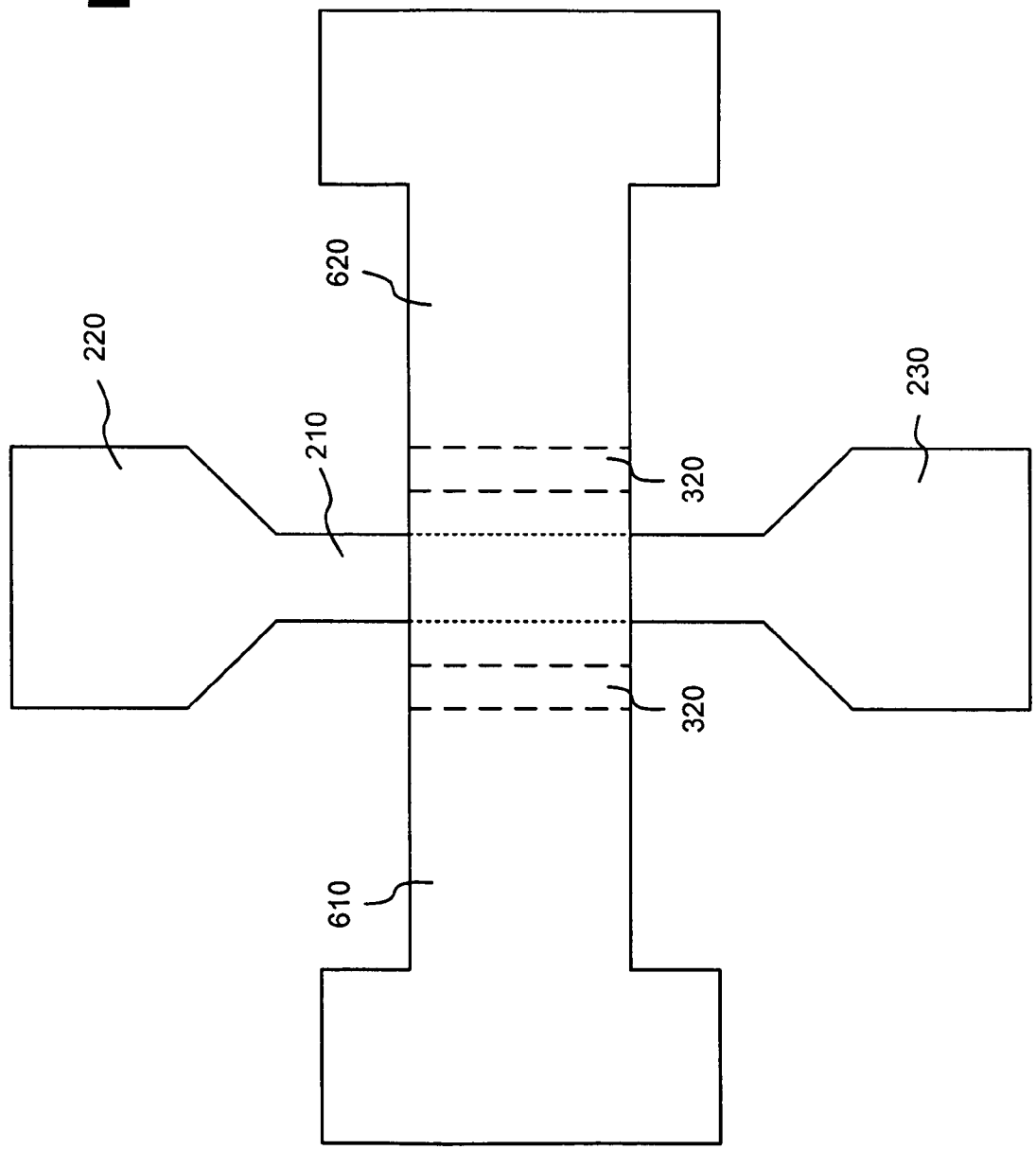
FIG. 6 is a top view illustrating an exemplary non-volatile memory device formed in accordance with an exemplary embodiment of the present invention.

Conductive layer 510 may then be patterned and etched to form the control gate for semiconductor device 100. For example, FIG. 6 illustrates an exemplary top view of semiconductor device 100 consistent with the present invention after the control gate electrode(s) are formed. Referring to FIG. 6, silicon layer 510 has been patterned and etched to form control gate electrodes 610 and 620 located on either side of fin 210. Conductive structures 320 are shown as dotted lines in FIG. 6 and may be located below the control gate layer (i.e., gate electrodes 610 and 620) near the sides of fin 210. Dielectric layer 410 is not shown in FIG. 6 for simplicity, but may be located below the control gate layer and functions to isolate the floating gate electrodes 320 from the control gate electrodes 610 and 620.

The source/drain regions 220 and 230 may then be doped. For example, n-type or p-type impurities may be implanted in source/drain regions 220 and 230. For example, an n-type dopant, such as phosphorous, may be implanted at a dosage of about $1 \times 10^{14}$ atoms/cm$^2$ to about $5 \times 10^{16}$ atoms/cm$^2$ and an implantation energy of about 0.1 KeV to about 50 KeV. Alternatively, a p-type dopant, such as boron, may be implanted at similar dosages and implantation energies. The particular implantation dosages and energies may be selected based on the particular end device requirements.

One of ordinary skill in this art would be able to optimize the source/drain implantation process based on the desired circuit requirements. In alternative implementations, source/drain regions 220 and 230 may be doped at an earlier step in the formation of semiconductor device 100, such as prior to formation of structures 320. In addition, sidewall spacers may optionally be formed prior to the source/drain ion implantation to control the location of the source/drain junctions based on the particular circuit requirements. Activation annealing may then be performed to activate the source/drain regions 220 and 230.

The resulting semiconductor device 100 illustrated in FIG. 6 includes fin 210, structures 320 and silicon control gates 610/620. Fin 210 may function as a substrate electrode for the memory device and structures 320 may function as floating gate electrodes.

Semiconductor device 100 can operate as a non-volatile memory device, such as an EEPROM. Programming may be accomplished by applying a bias of, for example, about 3 to 20 volts to control gate 610 or 620. For example, if the bias is applied to control gate 610, electrons may tunnel from fin 210 into floating gate electrode 320 via dielectric layer 410. A similar process may occur if the bias is applied to control gate 620. Erasing may be accomplished by applying a bias of, for example, about −3 to −20 volts to control gate 610/620.

Thus, in accordance with the present invention, a non-volatile memory device is formed using a FinFET structure. Advantageously, semiconductor device 100 has a double-gate structure with control gates 610 and 620 formed on either side of fin 210. Each of control gates 610 and 620 may be used to program the memory device. In addition, the FinFET structure enables the resulting memory device 100 to achieve increased circuit density as compared to conventional memory devices. The present invention can also be easily integrated into conventional semiconductor fabrication processing.

Figure 7:
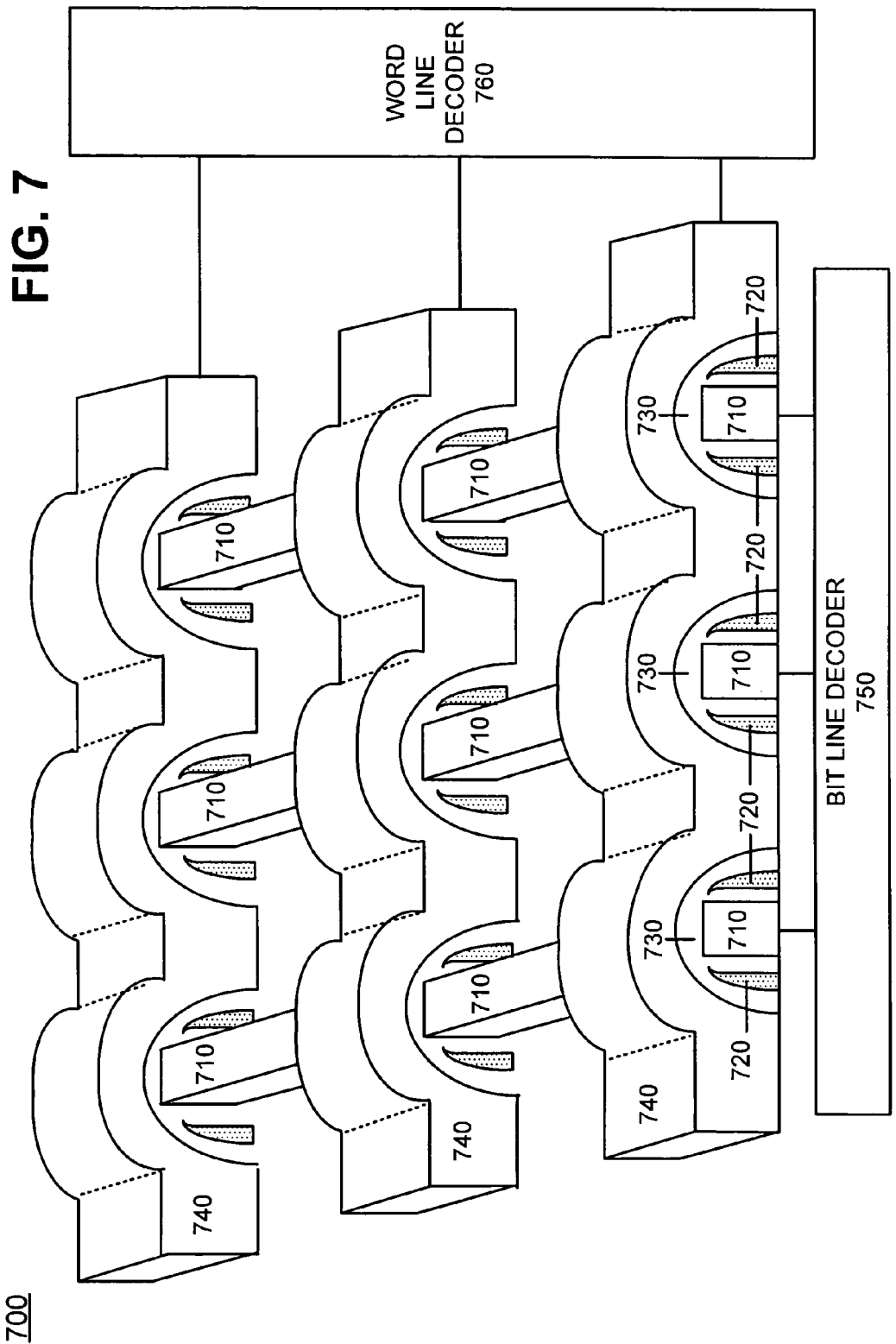
FIG. 7 is a perspective view illustrating an exemplary non-volatile memory array formed in accordance with an exemplary embodiment of the present invention.

The structure of semiconductor device 100 illustrated in FIG. 6 may be used to form a non-volatile memory array. For example, semiconductor device 100 in FIG. 6 includes a memory cell that may used to store a single bit of information. According to an exemplary implementation, a number of memory cells similar to that illustrated in FIG. 6 may be used to form a memory array. For example, FIG. 7 illustrates an exemplary memory array 700 formed in accordance with an embodiment consistent with the present invention. Referring to FIG. 7, memory array 700 includes a number of silicon fins 710. Silicon fins 710 may be formed in a manner similar to that discussed above with respect to fin 210. Each of fins 710 may represent a substrate electrode and the fins 710 may be separated from each other by a predetermined distance in the lateral direction, such as 1000 Å.

A number of floating gate electrodes 720 and a dielectric layer 730 may then be formed near fins 710, as illustrated in FIG. 7. Floating gate electrodes 720 and dielectric layer 730 may be formed in a manner similar to floating gate electrodes 320 and dielectric layer 410, described above with respect to FIGS. 3 and 4. A conductive layer, such as a silicon layer, may then be deposited, patterned and etched to form control gates 740 over fins 710, floating gate electrodes 720 and dielectric layer 730, as illustrated in FIG. 7. Control gates 740 may be formed in a similar manner to control gates 610/620, described above with respect to FIG. 6. Each of control gates 740 may represent a word line of memory array 700.

A bit line decoder 750 and word line decoder 760 may then be coupled to the bit lines 710 and word lines 740, respectively. The bit line and word line decoders 750 and 760 may then be used to facilitate programming or reading out data stored in each particular cell of memory array 700. In this manner, a high density non-volatile memory array may be formed using a FinFET structure.

OTHER EMBODIMENTS

In other embodiments of the present invention, a memory device with a nanocrystal floating gate electrode may be formed, as illustrated in FIGS. 8A–8E. Referring to FIG. 8A, semiconductor device 800 may include a silicon on insulator structure with a buried oxide layer 810 formed on a substrate (not shown) and a silicon fin 820 formed on buried oxide layer 810. Fin 820 may then be masked and a portion of buried oxide layer 810 may be removed, as illustrated in FIG. 8B. For example, a portion of buried oxide layer 810 located below fin 820 may be removed by, for example, a wet etch process. After fin 820 has been undercut, an oxide layer 830 may be thermally grown or deposited on the exposed surfaces of fin 820, as illustrated in FIG. 8B. Next, a silicon layer 840, such as a polycrystalline silicon, may be deposited over semiconductor device 800, as illustrated in FIG. 8C.

Silicon layer 840 may then be oxidized to form a silicon oxide layer 850, as illustrated in FIG. 8D. During the oxidation of silicon layer 840, portions of silicon layer 840 may not oxidize. For example, silicon structures 860 may form below the corners of fin 820, resulting from the non-oxidation of portions of silicon layer 840. These silicon structures 860 may be very thin, such as nanocrystalline structures, and may function as floating gate electrodes for semiconductor device 800.

Next, a polysilicon layer 870 may be deposited over semiconductor device 800, as illustrated in FIG. 8E. Polysilicon layer 870 may function as the control gate electrode for semiconductor device 800. The resulting semiconductor device 800 may function as a non-volatile memory device, with fin 820 functioning as a substrate electrode, structures 860 functioning as floating gate electrodes and control gate layer 870 functioning as a control gate for the memory device.

In another embodiment, a FinFET device having a split gate may be formed. For example, referring to FIG. 9, semiconductor device 900 may include a silicon fin 920 formed on an oxide layer 910, which may be formed on a silicon substrate (not shown). A material, such as a silicon oxide, may be deposited and patterned to form spacers (not shown) adjacent the sides of fin 920. The spacers may be formed in a manner similar to the formation of spacers 310 (FIG. 3) described above. A conductive material, such as a polycrystalline silicon, may then be deposited to form structures 930, as illustrated in FIG. 9. The dielectric spacers may then be removed. The resulting semiconductor device 900 includes a split gate structure, with each of structures 930 acting as a gate electrode for the FinFET device.

Figure 10A:
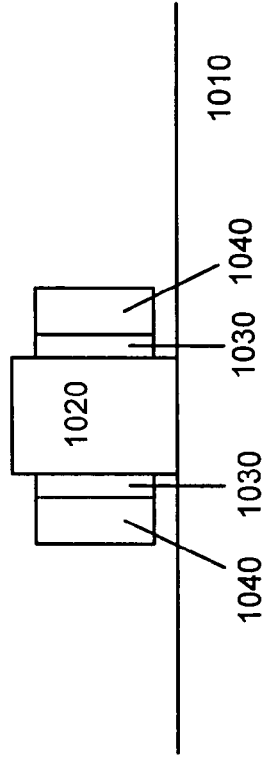
FIGS. 10A and 10B are cross-sections illustrating the formation of a semiconductor device with metal floating gate electrodes in accordance with another embodiment of the present invention.

In another embodiment, a memory device with a metal floating gate may be formed. For example, referring to FIG. 10A, semiconductor device 1000 includes a buried oxide layer 1010 formed on a substrate (not shown) with a silicon fin 1020 formed thereon. A number of layers may then be formed adjacent fin 1020. For example, an oxide layer 1030 may be formed on the side surfaces of fin 1020, followed by the formation of metal layers 1040 adjacent oxide layers 1030, as illustrated in FIG. 10A.

Figure 10B:
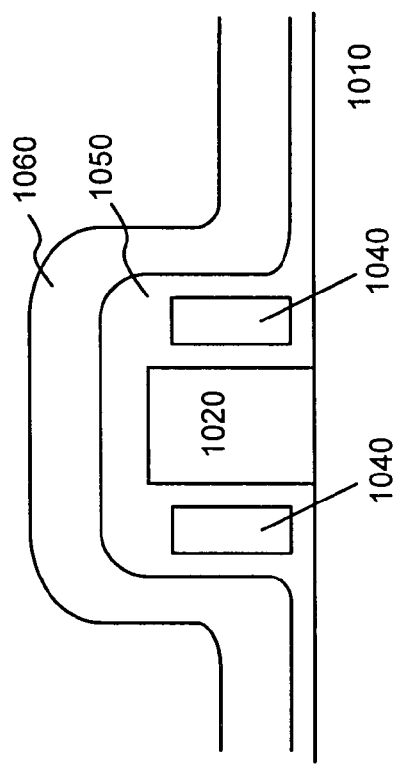

Oxide layers 1030 may then be removed, as illustrated in FIG. 10B. A dielectric layer 1050 may then be formed over fin 1020 and metal layers 1040, followed by the formation of a silicon layer 1060. Silicon layer 1060 may comprise polysilicon and may be patterned and etched to form a control gate for semiconductor device 1000. Metal structures 1040 may function as floating gate electrodes for semiconductor device 1000 and fin 1020 may function as a substrate electrode.

In yet another embodiment, a FinFET memory device with multiple floating gates may be formed. For example, referring to FIG. 11, semiconductor device 1100 includes fin 1120 formed on buried oxide layer 1110, which may be formed on a silicon substrate (not shown). Spacers (not shown) and conductive structures 1130 may be formed near fin 1120 in a manner similar to the formation of spacers 310 and structures 320 described above. Conductive structures 1130 may function as floating gate electrodes for semiconductor device 1100. Additional spacers (not shown) may be formed adjacent conductive structures 1130, followed by formation of conductive structures 1140. Conductive structures 1140 may also function as floating gate electrodes for semiconductor device 1100. A dielectric layer 1150 may then be formed over fin 1120 and floating gate electrodes 1130 and 1140, as illustrated in FIG. 11.

Figure 11:
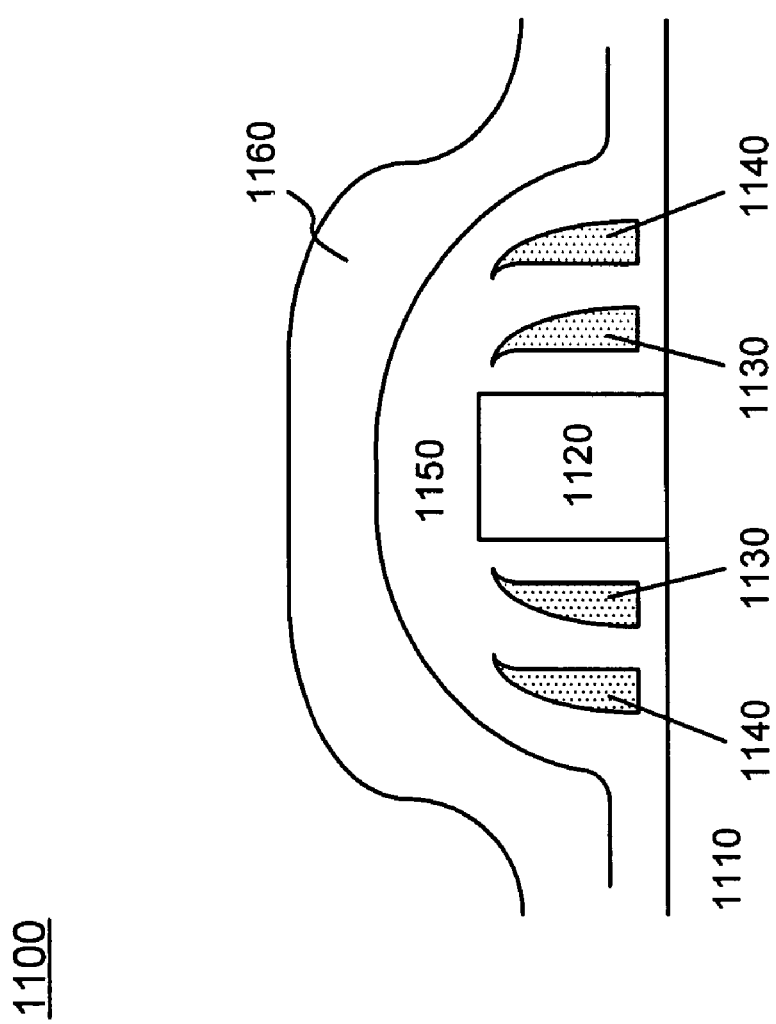
FIG. 11 is a cross-section illustrating the formation of a semiconductor device with multiple floating gate electrodes in accordance with another embodiment of the present invention.

A control gate material 1160 may then be patterned and etched to form a control gate electrode for semiconductor device 1100, as illustrated in FIG. 11. In this embodiment, two sets of floating gate electrodes 1130 and 1140 are illustrated as being formed near the respective sides of fin 1120. In other embodiments, the number of floating gate electrodes may be increased.

In another embodiment, a memory device may be formed using a FinFET structure and metal induced crystallization process to form a floating gate electrode. For example, a FinFET structure may be formed using a fin as a substrate electrode, such as fin 1120 formed on buried oxide layer 1110 illustrated in FIG. 11. Next a dielectric layer, such as an oxide layer, may be formed over fin 1120 to function as a tunnel oxide layer. An amorphous silicon layer may then be formed over the tunnel oxide layer, followed by deposition of a relatively thin metal layer. A metal induced crystallization (MIC) process may then be performed to convert the amorphous silicon layer into a crystalline silicon. For example, an annealing may be performed to convert the amorphous silicon layer into a crystalline silicon. The crystalline silicon may then be used to form a floating gate electrode for the memory device. A control gate may then be formed over the fin and floating gate electrode. In this manner, an MIC process is used to form a floating gate electrode for a memory device.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable in the manufacturing of FinFET semiconductor devices and particularly in FinFET devices with design features of 100 nm and below. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail. In addition, while series of processes for forming the semiconductor devices of FIGS. 1–11 have been described, it should be understood that the order of the process steps may be varied in other implementations consistent with the present invention.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

In addition, no element, act, or instruction used in the description of the present application should be construed as critical or essential to the invention unless explicitly described as such. Also, as used herein, the article "a" is intended to include one or more items. Where only one item is intended, the term "one" or similar language is used.

What is claimed is:

1. A memory device, comprising:
    a substrate;
    an insulating layer formed on the substrate;
    a fin structure formed on the insulating layer, the fin structure functioning as a substrate electrode for the memory device;
    at least one conductive structure formed near a side of the fin structure, the at least one conductive structure acting as a floating gate electrode for the memory device; and
    a control gate formed over the fin structure.

2. The memory device of claim 1, further comprising:
    a dielectric layer formed adjacent at least side surfaces of the fin structure, the dielectric layer acting as a tunnel layer.

3. The memory device of claim 2, wherein the at least one conductive structure comprises first and second silicon structures formed near a first side and a second side of the fin structure, respectively, the first and second silicon structures each having a width ranging from about 50 Å to about 1200 Å.

4. The memory device of claim 2, wherein the dielectric layer is further formed between the control gate and the fin structure.

5. The memory device of claim 1, wherein the control gate comprises polysilicon and has a thickness ranging about 400 Å to about 4000 Å.

6. The memory device of claim 1, wherein the insulating layer comprises a buried oxide layer and the fin structure comprises at least one of silicon or germanium.

7. The memory device of claim 1, wherein the fin structure has a width ranging from about 100 Å to about 3000 Å.

8. The memory device of claim 1, further comprising:
    a source region formed on the insulating layer and disposed adjacent a first end of the fin structure; and
    a drain region formed on the insulating layer and disposed adjacent a second end of the fin structure.

9. A non-volatile memory device, comprising:
    a substrate;
    an insulating layer formed on the substrate;
    a conductive fin formed on the insulating layer, the conductive fin functioning as a substrate electrode;

a dielectric formed adjacent at least side surfaces of the fin;

at least one conductive structure formed adjacent the dielectric, the at least one conductive structure acting as a floating gate electrode for the non-volatile memory device; and a gate formed over the dielectric and the at least one conductive structure, wherein the gate acts as a control gate for the non-volatile memory device.

10. The non-volatile memory device of claim 9, further comprising:

a source region formed on the insulating layer adjacent a first end of the conductive fin; and a drain region formed on the insulating layer adjacent a second end of the conductive fin opposite the first end.

11. The non-volatile memory device of claim 9, wherein the at least one conductive structure comprises at least one silicon structure formed near at least one of a first or second side surface of the conductive fin, the at least one silicon structure having a width ranging from about 50 Å to about 1200 Å.

12. The non-volatile memory device of claim 9, wherein the gate comprises polysilicon having a thickness ranging from about 40 Å to about 4000 Å in the channel region of the non-volatile memory device.

13. The non-volatile memory device of claim 9, wherein the insulating layer comprises a buried oxide layer and the conductive fin comprises at least one of silicon or germanium.

14. The non-volatile memory device of claim 9, wherein the conductive fin has a thickness ranging from about 100 Å to about 3000 Å.

15. A non-volatile memory array, comprising:

a substrate;

an insulating layer formed on the substrate;

a plurality of conductive fins formed on the insulating layer, the conductive fins acting as substrate electrodes for the non-volatile memory array;

a dielectric formed adjacent side surfaces and over a top surface of each of the plurality of conductive fins;

a plurality of conductive structures formed near side surfaces of each of the plurality of conductive fins and adjacent the dielectric, the plurality of conductive structures acting as floating gate electrodes for the non-volatile memory array; and a plurality of gates formed over the plurality of fins and the plurality of conductive structures, the plurality of gates acting as word lines for the non-volatile memory array.

16. The non-volatile memory array of claim 15, wherein the plurality of conductive structures comprises polysilicon and each of the plurality of conductive structures has a width ranging from about 50 Å to about 1200 Å.

17. The memory device of claim 1, wherein the at least one conductive structure does not contact the insulating layer.

18. The memory device of claim 17, wherein the at least one conductive structure comprises a first conductive structure and a second conductive structure, the first and second conductive structures each having side surfaces and a bottom surface, the memory device further comprising:

a dielectric formed adjacent the side surfaces and below the bottom surface of each of the first and second conductive structures.

19. The non-volatile memory device of claim 9, wherein the at least one conductive structure does not contact the insulating layer.

20. The non-volatile memory device of claim 9, wherein the dielectric is further formed between a bottom surface of the at least one conductive structure and the insulating layer.

21. The non-volatile memory array of claim 15, wherein the plurality of conductive structures do not contact the insulating layer.

* * * * *